(12) United States Patent
Sirinorakul et al.

(10) Patent No.: US 9,449,900 B2
(45) Date of Patent: Sep. 20, 2016

(54) LEADFRAME FEATURE TO MINIMIZE FLIP-CHIP SEMICONDUCTOR DIE COLLAPSE DURING FLIP-CHIP REFLOW

(75) Inventors: Saravuth Sirinorakul, Bangkok (TH); Suebphong Yenrudee, Bangkok (TH)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 350 days.

(21) Appl. No.: 12/834,688

(22) Filed: Jul. 12, 2010

(65) Prior Publication Data

US 2011/0018111 A1 Jan. 27, 2011

Related U.S. Application Data

(60) Provisional application No. 61/228,035, filed on Jul. 23, 2009.

(51) Int. Cl.
*H01L 23/495* (2006.01)
*H01L 21/48* (2006.01)
*H01L 23/00* (2006.01)

(52) U.S. Cl.
CPC ..... *H01L 23/49513* (2013.01); *H01L 21/4821* (2013.01); *H01L 23/495* (2013.01); *H01L 24/14* (2013.01); *H01L 24/81* (2013.01); *H01L 23/49582* (2013.01); *H01L 24/13* (2013.01); *H01L 24/16* (2013.01); *H01L 2224/11822* (2013.01); *H01L 2224/131* (2013.01); *H01L 2224/13099* (2013.01); *H01L 2224/16* (2013.01); *H01L 2224/16245* (2013.01); *H01L 2224/81193* (2013.01); *H01L 2224/81194* (2013.01); *H01L 2224/81801* (2013.01); *H01L 2924/014* (2013.01); *H01L 2924/01005* (2013.01); *H01L 2924/01006* (2013.01);

(Continued)

(58) Field of Classification Search
CPC .............. H01L 21/4821; H01L 24/13–24/14; H01L 23/49513; H01L 2224/13099; H01L 2224/81193; H01L 2224/81801; H01L 2924/01078; H01L 2924/01005; H01L 2924/01033; H01L 2924/014; H01L 2224/11822; H01L 2924/10253; H01L 2224/131
USPC ................. 257/666–677, E33.066, 737–738, 257/780–781, E23.021; 438/123, 632, 646, 438/698, 760, 436–438
See application file for complete search history.

(56) References Cited

U.S. PATENT DOCUMENTS 3,611,061 A 10/1971 Segerson ................. 317/234 R
4,411,719 A 10/1983 Lindberg ........................ 156/64

(Continued)

OTHER PUBLICATIONS

Michael Quirk and Julian Serda, Semiconductor Manufacturing Technology, Pearson Education International, Pearson Prentice Hall , 2001, p. 587-588.

(Continued)

*Primary Examiner* — Cuong B Nguyen
(74) *Attorney, Agent, or Firm* — Haverstock & Owens LLP

(57) ABSTRACT

A support feature on a leadframe to support a semiconductor die during placement of the die on the leadframe and minimize the collapsing effect of the connector bumps of the die after reflowing. In some embodiments, the support features are formed from material that is different from the leadframe, such as by a ball drop process or a plating process. In some embodiments, the support features are formed from the leadframe material, such as by etching. In some embodiments, the support features are covered with a coating material.

13 Claims, 14 Drawing Sheets

(52) U.S. Cl.
CPC ............ *H01L 2924/01033* (2013.01); *H01L 2924/01046* (2013.01); *H01L 2924/01047* (2013.01); *H01L 2924/01078* (2013.01); *H01L 2924/01079* (2013.01); *H01L 2924/10253* (2013.01); *H01L 2924/181* (2013.01)

(56) References Cited

U.S. PATENT DOCUMENTS

| | | | |
|---|---|---|---|
| 4,501,960 A | 2/1985 | Jouvet et al. | 235/492 |
| 4,801,561 A | 1/1989 | Sankhagowit | 437/207 |
| 4,855,672 A | 8/1989 | Shreeve | 324/158 R |
| 5,105,259 A | 4/1992 | McShane et al. | |
| 5,195,023 A | 3/1993 | Manzione et al. | |
| 5,247,248 A | 9/1993 | Fukunaga | 324/158 |
| 5,248,075 A | 9/1993 | Young et al. | 228/5.1 |
| 5,281,851 A | 1/1994 | Mills et al. | |
| 5,396,185 A | 3/1995 | Honma et al. | 324/754 |
| 5,397,921 A | 3/1995 | Karnezos | 257/779 |
| 5,479,105 A | 12/1995 | Kim et al. | 324/755 |
| 5,535,101 A | 7/1996 | Miles et al. | |
| 5,596,231 A | 1/1997 | Combs | 257/776 |
| 5,843,808 A | 12/1998 | Karnezos | 438/121 |
| 5,959,363 A | 9/1999 | Yamada et al. | |
| 5,990,692 A | 11/1999 | Jeong et al. | 324/755 |
| 6,072,239 A | 6/2000 | Yoneda et al. | 257/730 |
| 6,111,324 A | 8/2000 | Sheppard et al. | 257/787 |
| 6,159,770 A | 12/2000 | Tetaka et al. | 438/112 |
| 6,177,729 B1* | 1/2001 | Benenati et al. | 257/738 |
| 6,197,615 B1 | 3/2001 | Song et al. | |
| 6,208,020 B1 | 3/2001 | Minamio et al. | |
| 6,229,200 B1 | 5/2001 | Mclellan et al. | 257/666 |
| 6,242,281 B1 | 6/2001 | Mclellan et al. | 438/106 |
| 6,250,841 B1 | 6/2001 | Ledingham | |
| 6,284,569 B1 | 9/2001 | Sheppard et al. | 438/110 |
| 6,285,075 B1 | 9/2001 | Combs et al. | 257/675 |
| 6,294,100 B1 | 9/2001 | Fan et al. | 216/14 |
| 6,304,000 B1 | 10/2001 | Isshiki et al. | 257/782 |
| 6,326,678 B1 | 12/2001 | Karnezos et al. | 257/666 |
| 6,329,711 B1 | 12/2001 | Kawahara et al. | 257/698 |
| 6,353,263 B1 | 3/2002 | Dotta et al. | 257/777 |
| 6,372,625 B1 | 4/2002 | Shigeno et al. | |
| 6,376,921 B1 | 4/2002 | Yoneda et al. | 257/787 |
| 6,384,472 B1 | 5/2002 | Huang | |
| 6,392,427 B1 | 5/2002 | Yang | 324/755 |
| 6,414,385 B1 | 7/2002 | Huang et al. | 257/690 |
| 6,429,048 B1 | 8/2002 | McLellan et al. | 438/108 |
| 6,451,709 B1 | 9/2002 | Hembree | 438/759 |
| 6,455,348 B1 | 9/2002 | Yamaguchi | 438/106 |
| 6,476,469 B2 | 11/2002 | Hung et al. | |
| 6,489,218 B1 | 12/2002 | Kim et al. | |
| 6,498,099 B1 | 12/2002 | McLellan et al. | 438/689 |
| 6,507,116 B1 | 1/2003 | Caletka et al. | |
| 6,545,332 B2 | 4/2003 | Huang | 257/433 |
| 6,545,347 B2 | 4/2003 | McClellan | 257/690 |
| 6,552,417 B2 | 4/2003 | Combs | 257/666 |
| 6,552,423 B2 | 4/2003 | Song et al. | 257/679 |
| 6,566,740 B2 | 5/2003 | Yasunaga et al. | 257/670 |
| 6,573,121 B2 | 6/2003 | Yoneda et al. | 438/106 |
| 6,585,905 B1 | 7/2003 | Fan et al. | 216/14 |
| 6,586,834 B1 | 7/2003 | Sze et al. | 257/712 |
| 6,635,957 B2 | 10/2003 | Kwan et al. | 257/691 |
| 6,667,191 B1 | 12/2003 | McLellan et al. | 438/121 |
| 6,683,368 B1* | 1/2004 | Mostafazadeh | 257/676 |
| 6,686,667 B2 | 2/2004 | Chen et al. | |
| 6,703,696 B2 | 3/2004 | Ikenaga et al. | 257/678 |
| 6,723,585 B1 | 4/2004 | Tu et al. | |
| 6,724,071 B2 | 4/2004 | Combs | 257/666 |
| 6,734,044 B1 | 5/2004 | Fan et al. | 438/123 |
| 6,734,552 B2 | 5/2004 | Combs et al. | 257/707 |
| 6,737,755 B1 | 5/2004 | McLellan et al. | 257/796 |
| 6,750,546 B1* | 6/2004 | Villanueva et al. | 257/778 |
| 6,764,880 B2 | 7/2004 | Wu et al. | 438/123 |
| 6,781,242 B1 | 8/2004 | Fan et al. | 257/777 |
| 6,800,948 B1 | 10/2004 | Fan et al. | 257/783 |
| 6,812,552 B2 | 11/2004 | Islam et al. | |
| 6,818,472 B1 | 11/2004 | Fan et al. | 438/106 |
| 6,818,978 B1 | 11/2004 | Fan | 257/686 |
| 6,818,980 B1 | 11/2004 | Pedron, Jr. | 257/706 |
| 6,841,859 B1 | 1/2005 | Thamby et al. | 257/676 |
| 6,876,066 B2 | 4/2005 | Fee et al. | 257/666 |
| 6,894,376 B1 | 5/2005 | Mostafazadeh et al. | |
| 6,897,428 B2 | 5/2005 | Minamio et al. | |
| 6,927,483 B1 | 8/2005 | Lee et al. | |
| 6,933,176 B1 | 8/2005 | Kirloskar et al. | 438/122 |
| 6,933,594 B2 | 8/2005 | McLellan et al. | 257/676 |
| 6,940,154 B2 | 9/2005 | Pedron et al. | 257/666 |
| 6,946,324 B1 | 9/2005 | McLellan et al. | 438/111 |
| 6,964,918 B1 | 11/2005 | Fan et al. | 438/614 |
| 6,967,126 B2 | 11/2005 | Lee et al. | 438/122 |
| 6,979,594 B1 | 12/2005 | Fan et al. | 438/113 |
| 6,982,491 B1 | 1/2006 | Fan et al. | 257/778 |
| 6,984,785 B1 | 1/2006 | Diao et al. | 174/52.2 |
| 6,989,294 B1 | 1/2006 | McLellan et al. | 438/111 |
| 6,995,460 B1 | 2/2006 | McLellan et al. | 257/676 |
| 7,008,825 B1 | 3/2006 | Bancod et al. | 438/123 |
| 7,009,286 B1 | 3/2006 | Kirloskar et al. | 257/684 |
| 7,041,533 B1* | 5/2006 | Akram et al. | 438/108 |
| 7,045,883 B1* | 5/2006 | McCann et al. | 257/673 |
| 7,049,177 B1 | 5/2006 | Fan et al. | |
| 7,052,935 B2* | 5/2006 | Pai et al. | 438/106 |
| 7,060,535 B1 | 6/2006 | Sirinorakul et al. | |
| 7,071,545 B1 | 7/2006 | Patel et al. | 257/686 |
| 7,091,581 B1 | 8/2006 | McLellan et al. | 257/673 |
| 7,101,210 B2 | 9/2006 | Lin et al. | 439/331 |
| 7,102,210 B2 | 9/2006 | Ichikawa | 257/666 |
| 7,125,747 B2 | 10/2006 | Lee et al. | |
| 7,126,218 B1 | 10/2006 | Darveaux et al. | |
| 7,205,178 B2 | 4/2007 | Shiu et al. | 438/110 |
| 7,224,048 B1 | 5/2007 | McLellan et al. | 257/678 |
| 7,247,526 B1 | 7/2007 | Fan et al. | 438/123 |
| 7,253,503 B1* | 8/2007 | Fusaro et al. | 257/668 |
| 7,259,678 B2 | 8/2007 | Brown et al. | |
| 7,268,415 B2* | 9/2007 | Abbott et al. | 257/666 |
| 7,274,088 B2 | 9/2007 | Wu et al. | 257/673 |
| 7,314,820 B2 | 1/2008 | Lin et al. | 438/617 |
| 7,315,077 B2 | 1/2008 | Choi et al. | |
| 7,315,080 B1 | 1/2008 | Fan et al. | 257/717 |
| 7,342,305 B1 | 3/2008 | Diao et al. | 257/706 |
| 7,344,920 B1 | 3/2008 | Kirloskar et al. | 438/123 |
| 7,348,663 B1 | 3/2008 | Kirloskar et al. | 257/704 |
| 7,358,119 B2 | 4/2008 | McLellan et al. | 438/127 |
| 7,371,610 B1 | 5/2008 | Fan et al. | 438/112 |
| 7,372,151 B1 | 5/2008 | Fan et al. | 257/738 |
| 7,381,588 B1 | 6/2008 | Patel et al. | 438/109 |
| 7,399,658 B2 | 7/2008 | Shim et al. | |
| 7,408,251 B2 | 8/2008 | Hata et al. | 257/678 |
| 7,411,289 B1 | 8/2008 | McLellan et al. | 257/700 |
| 7,449,771 B1 | 11/2008 | Fan et al. | 257/676 |
| 7,459,345 B2* | 12/2008 | Hwan | 438/121 |
| 7,482,690 B1 | 1/2009 | Fan et al. | 257/724 |
| 7,495,319 B2 | 2/2009 | Fukuda et al. | |
| 7,595,225 B1 | 9/2009 | Fan et al. | 438/112 |
| 7,608,484 B2 | 10/2009 | Lange et al. | |
| 7,709,857 B2 | 5/2010 | Kim et al. | |
| 7,714,418 B2 | 5/2010 | Lim et al. | |
| 8,035,207 B2 | 10/2011 | Camacho et al. | |
| 2001/0005047 A1* | 6/2001 | Jimarez et al. | B23K 1/0016 257/687 |
| 2001/0007285 A1 | 7/2001 | Yamada et al. | |
| 2002/0109214 A1 | 8/2002 | Minamio et al. | |
| 2003/0006055 A1 | 1/2003 | Chien-Hung et al. | |
| 2003/0045032 A1 | 3/2003 | Abe | |
| 2003/0071333 A1 | 4/2003 | Matsuzawa | |
| 2003/0143776 A1 | 7/2003 | Pedron, Jr. et al. | 438/106 |
| 2003/0178719 A1 | 9/2003 | Combs et al. | 257/704 |
| 2003/0201520 A1 | 10/2003 | Knapp et al. | 257/666 |
| 2003/0207498 A1 | 11/2003 | Islam et al. | 438/120 |
| 2003/0234454 A1 | 12/2003 | Pedron et al. | |
| 2004/0014257 A1 | 1/2004 | Kim et al. | 438/111 |
| 2004/0026773 A1 | 2/2004 | Koon et al. | |
| 2004/0046237 A1 | 3/2004 | Abe et al. | |
| 2004/0046241 A1 | 3/2004 | Combs et al. | 257/678 |
| 2004/0070055 A1 | 4/2004 | Punzalan et al. | |
| 2004/0080025 A1 | 4/2004 | Kasahara et al. | |

(56) References Cited

U.S. PATENT DOCUMENTS

| | | | |
|---|---|---|---|
| 2004/0110319 A1 | 6/2004 | Fukutomi et al. | 438/106 |
| 2005/0003586 A1 | 1/2005 | Shimanuki et al. | |
| 2005/0077613 A1 | 4/2005 | McLellan et al. | 257/706 |
| 2005/0236701 A1 | 10/2005 | Minamio et al. | |
| 2005/0263864 A1 | 12/2005 | Islam et al. | |
| 2006/0019481 A1* | 1/2006 | Liu et al. | 438/614 |
| 2006/0071351 A1 | 4/2006 | Lange | |
| 2006/0170081 A1* | 8/2006 | Gerber et al. | 257/666 |
| 2006/0192295 A1* | 8/2006 | Lee et al. | H01L 23/16 257/778 |
| 2006/0223229 A1 | 10/2006 | Kirloskar et al. | 438/106 |
| 2006/0223237 A1 | 10/2006 | Combs et al. | 438/122 |
| 2006/0237231 A1* | 10/2006 | Hata et al. | H01L 23/49582 174/521 |
| 2006/0273433 A1 | 12/2006 | Itou et al. | |
| 2007/0001278 A1 | 1/2007 | Jeon et al. | |
| 2007/0013038 A1 | 1/2007 | Yang | |
| 2007/0029540 A1* | 2/2007 | Kajiwara et al. | 257/13 |
| 2007/0093000 A1 | 4/2007 | Shim et al. | |
| 2007/0200210 A1 | 8/2007 | Zhao et al. | 257/676 |
| 2007/0235217 A1 | 10/2007 | Workman | 174/260 |
| 2008/0048308 A1 | 2/2008 | Lam | 257/686 |
| 2008/0150094 A1 | 6/2008 | Anderson | 257/659 |
| 2008/0293232 A1* | 11/2008 | Kang et al. | 438/612 |
| 2009/0014848 A1* | 1/2009 | Ong Wai Lian et al. | H01L 24/48 257/666 |
| 2009/0152691 A1* | 6/2009 | Nguyen et al. | 257/667 |
| 2009/0152694 A1 | 6/2009 | Bemmerl et al. | |
| 2009/0230525 A1 | 9/2009 | Chang Chien et al. | |
| 2009/0236713 A1 | 9/2009 | Xu et al. | |
| 2009/0321778 A1* | 12/2009 | Chen et al. | 257/99 |
| 2010/0133565 A1 | 6/2010 | Cho et al. | |
| 2010/0149773 A1 | 6/2010 | Said | |
| 2010/0178734 A1 | 7/2010 | Lin | |
| 2010/0224971 A1 | 9/2010 | Li | |
| 2011/0115061 A1 | 5/2011 | Krishnan et al. | |
| 2011/0201159 A1 | 8/2011 | Mori et al. | |
| 2013/0069221 A1 | 3/2013 | Lee et al. | |

OTHER PUBLICATIONS

Office Action dated Apr. 25, 2012, U.S. Appl. No. 12/960,268, filed Dec. 3, 2010, Somchai Nondhasitthichai et al.

Notice of Allowance, dated Nov. 28, 2012, U.S. Appl. No. 12/960,268, filed Dec. 3, 2012, Saravuth Sirinorakul et al.

Non-Final Office Action mailed Dec. 20, 2012, U.S. Appl. No. 13/045,253, filed Mar. 10, 2011, Saravuth Sirinorakul.

* cited by examiner

LEADFRAME FEATURE TO MINIMIZE FLIP-CHIP SEMICONDUCTOR DIE COLLAPSE DURING FLIP-CHIP REFLOW

CROSS-REFERENCE TO RELATED APPLICATIONS

This application claims priority to U.S. Provisional Application Ser. No. 61/228,035, filed Jul. 23, 2009, entitled "LEADFRAME FEATURE TO MINIMIZE FLIP-CHIP SEMICONDUCTOR DIE COLLAPSE DURING FLIP-CHIP REFLOW," which is hereby incorporated by reference as if set forth herein.

FIELD OF THE INVENTION

The present invention relates to the field of semiconductor leadframes. More specifically, the present invention relates to leadframe features that are used to minimize flip-chip semiconductor die collapse.

BACKGROUND OF THE INVENTION

FIG. 1 is a perspective view of a prior art power semiconductor device 100. The power semiconductor device 100 comprises a power semiconductor device package 110. The device package 110 comprises a silicon die 120 partially or wholly encased within a molding compound 130. Typically, power semiconductor devices are operated in extreme conditions. When a high current is run through the device 100, heat is generated in the silicon die 120. The device 100 requires that the heat be removed efficiently. In most cases, a heat sink 140 is applied to the device package 110 as a heat extractor. In order to let the heat sink 140 contact the silicon die 120 directly, the silicon die 120 needs to be exposed from its package, as shown in FIG. 1.

FIG. 2 is a transparent view of the prior art power semiconductor device package 110, showing an X-rayed view of the device package 110. Typically, the device package 110 works with high electrical current. Most of the time, a flip chip die, such as die 120, is used for such a device. The flip chip die uses connector balls 255 to connect the silicon die to a leadframe 215.

FIGS. 3A-C illustrate different stages of a prior art flip-chip process used to place a semiconductor die 320 on a leadframe 315. In FIG. 3A, tacky soldering flux 350 is placed in a flux equalizer tray 360. A flux equalizer squeegee 370 then sweeps the flux 350 in order to level off its height along the tray 360. A pick-and-place arm 380 holds the die 320, dipping its connector balls or bumps (disposed on the underside of the die) into the thin film of flux 350, which is typically about ½ to ⅔ of the height of the bumps or a minimum of 25 microns, depending on the bump size. The consistency of the thickness of the film 350 across the area in which the bumps are immersed is critical. The more coplanar the die and bumps are, the more flexible the planarity requirements of controlling and maintaining the flux film thickness. In FIG. 3B, the pick-and-place arm 380 places the die 320 on the leadframe strip 315. At this step, the die 320 is adhered onto the leadframe 315 by flux viscosity. FIG. 3C shows the leadframe strip 315 after it has been reflowed. The solder flux activates and melts the solder bumps, thereby bonding the bumps and, as a result, the die 320 to the leadframe 315.

FIG. 4A illustrates a stand-off height between a flip-chip die 420 and a leadframe 415. This stand-off height should be controlled when the die 420 is passed through the reflow process. As previously mentioned, during the reflow process, the solder bumps 455 are melted and bonded to the leadframe 415. In order to achieve a properly exposed die, such as shown in FIG. 1, the stand-off height needs to be precisely achieved at a certain value at all points of the package.

FIGS. 4B-C illustrate improper stand off height between the flip-chip die 420 and the leadframe 415. In certain situations, something goes wrong in the fabrication process and the stand-off height cannot be controlled. In FIG. 4B, after the unit has passed through the reflow process, one side of the die 420 has collapsed bumps 457, while the other side has almost un-melted bumps 455'. As shown in FIG. 4C, if the unit with collapsed bumps passed through the molding process, the molding compound 430 would cover the collapsed part of the die 420 under the level of mold thickness. As a result, the device package 410 would not be able to be used because the contact area of the exposed die 420 would not fully contact the heat sink.

FIG. 5A is a perspective view of a flip-chip die 520 being dipped into soldering flux 550 in a tray 560. Plane 5B is a virtual cutting plane used to illustrate the cross-sectional view of FIG. 5B. As seen in FIG. 5B, the connector balls 555 of the flip-chip die 520 are partially dipped into the flux 550.

FIG. 6A is a perspective view of the flip-chip die 520 being placed onto a leadframe 615. Plane 6B is a virtual cutting plane used to illustrate the cross-sectional view of FIG. 6B. As seen in FIG. 6B, flip-chip die 520 is placed onto the leadframe 615 with the flux-coated portion (shaded) of the connector balls 555 being placed in direct contact with the leadframe 615.

FIGS. 7A-C illustrate a good process for bonding a semiconductor die 720 to a leadframe 715. In FIG. 7A, the connector bumps 755 of the semiconductor die 720 are dipped into soldering flux 750 in a tray 760. Here, the flux level is uniform. In FIG. 7B, the die 720 is placed on the leadframe 715 before the reflowing process. The flux-coated portion (shaded) of the connector bumps 755 are placed in direct contact with the leadframe 715. Here, the flux level on the bumps 755 is uniform. In FIG. 7C, after the reflowing has been performed, the melted bumps 755' connect the die 720 to the leadframe 715. Here, the melting of the bumps 755' is uniform. When consistency of the flux thickness across the area in which the bumps 755 are immersed is accomplished, good uniform bump melting after reflowing is achieved. As a result, the exact desired stand-off height is achieved at all points.

FIGS. 8A-D illustrate a bad process for bonding a semiconductor die 820 to a leadframe 815. FIG. 8A shows the connector bumps 855 of the die 820 being dipped into soldering flux 850 in a tray 860 where the flux level is not uniform throughout the tray 860. FIG. 8B shows the connector bumps 855 of the die 820 being dipped into soldering flux 850 in a tray 860 where the die 820 and the flux level are not coplanar (e.g., if the die 820 is dipped at an angle). As seen in FIG. 8C, as a result of either the non-uniform flux level or the non-coplanarity between the die 820 and the flux level, there is an insufficient amount of flux on some of the connector bumps and excessive flux on other connector bumps and, in some case, on the die itself. The die 820 is placed on the leadframe 815. A reflowing process is then performed. FIG. 8D shows the die 820 on the leadframe 815 after the reflowing process has been performed, with the melted bumps 855' connecting the die 820 to the leadframe 815. The connector bumps that had an insufficient amount of flux end up being almost un-melted after the reflowing process, whereas the connector bumps that had excessive flux end up collapsing, thereby resulting in an uneven melting of the connector bumps. Here, the vulnerability of the prior art is evident. If the consistency of the flux film thickness and coplanarity of the die and flux level are not achieved during flux dipping, then the crucial stand-off height at all points cannot be maintained after reflowing.

SUMMARY OF THE INVENTION

The present invention provides a way to minimize the collapsing effect of the connector bumps of the die after reflowing by creating a feature on the leadframe to support the die during placement of the die on the leadframe.

In one aspect of the present invention, a method of forming a leadframe device is provided. The method comprises: placing a flux material in a plurality of locations on a top surface of a leadframe; placing a metallic solder material on the flux material in the plurality of locations; and performing a reflow process on the leadframe, wherein the metallic solder material is melted to the top surface of the leadframe and formed into a plurality of support features that are configured to support a semiconductor die.

In some embodiments, the method further comprises: placing a semiconductor die over the leadframe, wherein a plurality of connector bumps are disposed on a bottom surface of the semiconductor die between the semiconductor die and the leadframe, and a flux material is disposed on each connector bump at a location between the connector bump and the leadframe; and performing a reflow process on the leadframe, thereby melting the connector bumps to the leadframe. In some embodiments, the liquidus temperature of the support features is higher than the liquidus temperature of the connector bumps. In some embodiments, the height of the support features is approximately 50%-80% of the height of the connector bumps before the connector bumps are melted.

In some embodiments, the metallic solder material is SAC105. In some embodiments, the support features are substantially ball-shaped. In some embodiments, the support features are each formed in the shape of an elongated bar.

In some embodiments, the method further comprises coating the support features with a coating material that is different from the material of the leadframe. In some embodiments, coating the support features comprises performing a screen print process. In some embodiments, coating the support features comprises performing a dispensing process. In some embodiments, the coating material is epoxy. In some embodiments, the method further comprises performing a curing process after the support features are coated with the coating material. In some embodiments, the coating material is a plating material. In some embodiments, the coating material is a plating material selected from the group consisting of: silver, nickel, palladium, and gold.

In another aspect of the present invention, a method of forming a leadframe device is provided. The method comprises: disposing a plating material and a leadframe in a plating solution, wherein the plating material is electrically coupled to an anode of an electrical power source, the leadframe is electrically coupled to the cathode of an electrical power source and has a top surface facing the plating material, and a plating mask having a plurality of openings is disposed between the top surface of the leadframe and the plating material; activating the electrical power source, thereby attracting particles from the plating material to the leadframe; and disposing the attracted particles onto the top surface of the leadframe at a plurality of locations aligned with the plurality of openings in the plating mask, thereby forming a plurality of support features on the top surface of the leadframe.

In some embodiments, the plating material comprises at least one material from the group of materials consisting of: silver, nickel, palladium, and gold.

In some embodiments, the method further comprises the step of performing a reflow process on the leadframe after the attracted particles are disposed onto the top surface of the leadframe.

In some embodiments, the method further comprises: placing a semiconductor die over the top surface of the leadframe, wherein a plurality of connector bumps are disposed on a bottom surface of the semiconductor die between the semiconductor die and the top surface of the leadframe, and a flux material is disposed on each connector bump at a location between the connector bump and the top surface of the leadframe; and performing a reflow process on the leadframe, thereby melting the connector bumps to the top surface of the leadframe.

In some embodiments, the liquidus temperature of the support features is higher than the liquidus temperature of the connector bumps. In some embodiments, the height of the support features is approximately 50%-80% of the height of the connector bumps before the connector bumps are melted.

In some embodiments, the support features are substantially ball-shaped. In some embodiments, the support features are each formed in the shape of an elongated bar.

In some embodiments, the method further comprises coating the support features with a coating material that is different from the material of the leadframe. In some embodiments, coating the support features comprises performing a screen print process. In some embodiments, coating the support features comprises performing a dispensing process. In some embodiments, the coating material is epoxy. In some embodiments, the method further comprises performing a curing process after the support features are coated with the coating material. In some embodiments, the coating material is a plating material. In some embodiments, the coating material is a plating material selected from the group consisting of silver, nickel, palladium, and gold.

In yet another aspect of the present invention, a leadframe device comprises: a leadframe having a top surface; a plurality of support features disposed on the top surface of the leadframe, wherein the support features comprise a material different from the leadframe and are configured to support a semiconductor die; and a coating material covering each support feature.

In some embodiments, the support features comprise epoxy. In some embodiments, the support features comprise at least one material from the group of materials consisting of: silver, nickel, palladium, and gold.

In some embodiments, the device further comprises a semiconductor die coupled to the top surface of the leadframe via a plurality of connector bumps disposed between the semiconductor die and the top surface of the leadframe.

In some embodiments, the support features are substantially ball-shaped. In some embodiments, the support features are each formed in the shape of an elongated bar.

In some embodiments, the coating material is epoxy. In some embodiments, the coating material is a plating material. In some embodiments, the coating material is a plating material selected from the group consisting of: silver, nickel, palladium, and gold.

In yet another aspect of the present invention, a method of forming a leadframe device is provided. The method comprises: forming a plurality of support features on a top surface of a leadframe, wherein the support features comprise a material different from the leadframe; and covering each support feature with a coating material.

In some embodiments, covering each support feature with the coating material comprises performing a screen print process. In some embodiments, covering each support feature with the coating material comprises performing a dispensing process. In some embodiments, the coating material is epoxy. In some embodiments, the method further comprises performing a curing process after the support features are covered with the coating material. In some embodiments, the coating material is a plating material. In some embodiments, the coating material is a plating material selected from the group consisting of: silver, nickel, palladium, and gold.

In some embodiments, the method further comprises: placing a semiconductor die over the top surface of the leadframe, wherein a plurality of connector bumps are disposed on a bottom surface of the semiconductor die between the semiconductor die and the top surface of the leadframe, and a flux material is disposed on each connector bump at a location between the connector bump and the top surface of the leadframe; and performing a reflow process on the leadframe, thereby melting the connector bumps to the top surface of the leadframe. In some embodiments, the liquidus temperature of the support features is higher than the liquidus temperature of the connector bumps. In some embodiments, the height of each support feature combined with the coating material covering the support feature is approximately 50%-110% of the height of the connector bumps before the connector bumps are melted.

In yet another aspect of the present invention, a leadframe device comprises: a leadframe consisting of leadframe material and having a top surface; and a plurality of support features extending from the top surface of the leadframe, wherein the support structures are formed from the leadframe material and are configured to support a semiconductor die.

In some embodiments, the device further comprises a semiconductor die coupled to the top surface of the leadframe via a plurality of connector bumps disposed between the semiconductor die and the top surface of the leadframe.

In some embodiments, the support features are substantially ball-shaped. In some embodiments, the support features are each formed in the shape of an elongated bar.

In some embodiments, each support feature is covered by a coating material. In some embodiments, the coating material is epoxy. In some embodiments, the coating material is a plating material. In some embodiments, the coating material is a plating material selected from the group consisting of: silver, nickel, palladium, and gold.

In yet another aspect of the present invention, a method of forming a leadframe device is provided. The method comprises: providing a leadframe having a top surface, wherein the leadframe is formed from leadframe material; and removing a portion of the leadframe material to form a plurality of support features extending from the top surface of the leadframe, wherein the support features are formed from the leadframe material and are configured to support a semiconductor die.

In some embodiments, the step of removing a portion of the leadframe material comprises performing an etching process on the leadframe.

In some embodiments, the method further comprises: placing a semiconductor die over the leadframe, wherein a plurality of connector bumps are disposed on a bottom surface of the semiconductor die between the semiconductor die and the leadframe, and a flux material is disposed on each connector bump at a location between the connector bump and the leadframe; and performing a reflow process on the leadframe, thereby melting the connector bumps to the leadframe. In some embodiments, the height of the support features is approximately 50%-80% of the height of the connector bumps before the connector bumps are melted.

In some embodiments, the support features are substantially ball-shaped. In some embodiments, the support features are each formed in the shape of an elongated bar.

In some embodiments, the method further comprises coating the support features with a coating material that is different from the material of the leadframe. In some embodiments, coating the support features comprises performing a screen print process. In some embodiments, coating the support features comprises performing a dispensing process. In some embodiments, the coating material is epoxy. In some embodiments, the method further comprises performing a curing process after the support features are coated with the coating material. In some embodiments, the coating material is a plating material. In some embodiments, the coating material is a plating material selected from the group consisting of: silver, nickel, palladium, and gold. In some embodiments, the method further comprises: placing a semiconductor die over the leadframe, wherein a plurality of connector bumps are disposed on a bottom surface of the semiconductor die between the semiconductor die and the leadframe, and a flux material is disposed on each connector bump at a location between the connector bump and the leadframe; and performing a reflow process on the leadframe, thereby melting the connector bumps to the leadframe. In some embodiments, the height of each support feature combined with the coating material covering the support feature is approximately 50%-110% of the height of the connector bumps before the connector bumps are melted.

DETAILED DESCRIPTION OF THE INVENTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

This disclosure provides several embodiments of the present invention. It is contemplated that any features from any embodiment can be combined with any features from any other embodiment. In this fashion, hybrid configurations of the illustrated and described embodiments are well within the scope of the present invention.

The present invention provides a way to minimize the collapsing of the connector bumps of the die after reflowing by creating features on the leadframe to support the die during placement of the die on the leadframe. These support features can be configured in a variety of ways, being formed in a variety of shapes and from a variety of materials.

Figure 1:
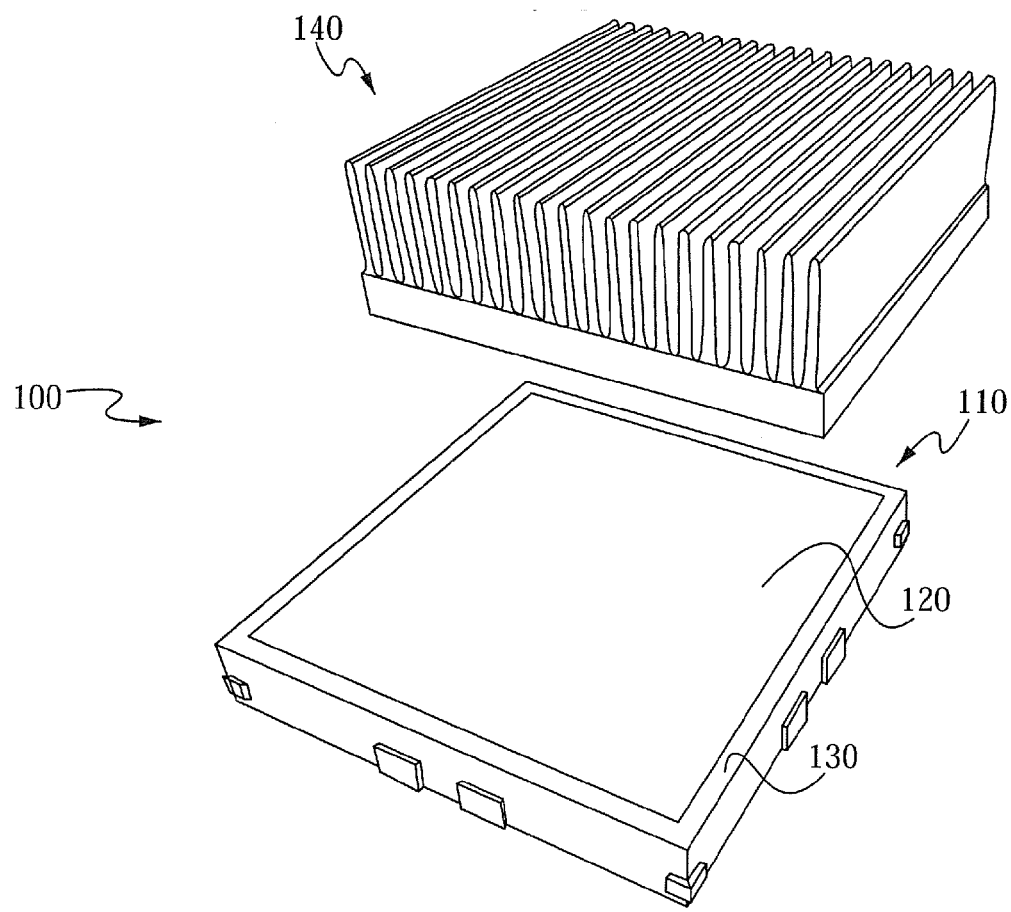
FIG. 1 is a perspective view of a prior art power semiconductor device.
Figure 2:
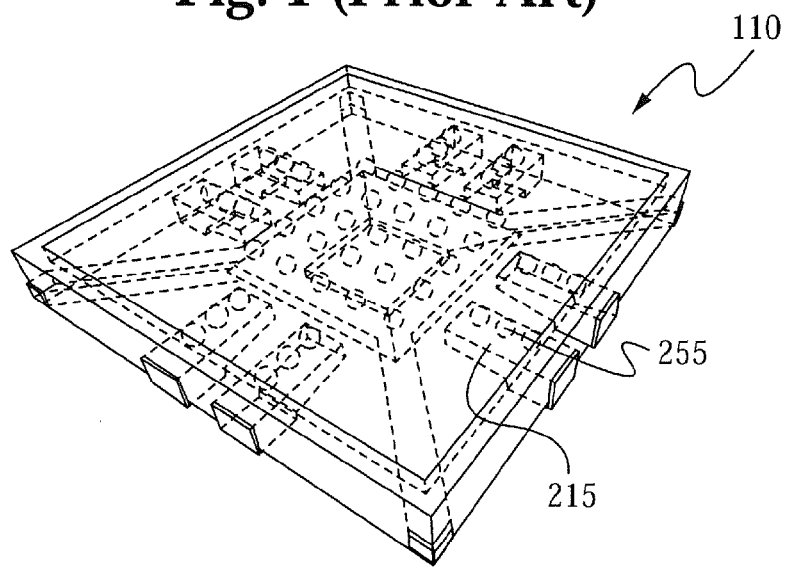
FIG. 2 is a transparent view of a prior art power semiconductor device package.
Figure 3A:
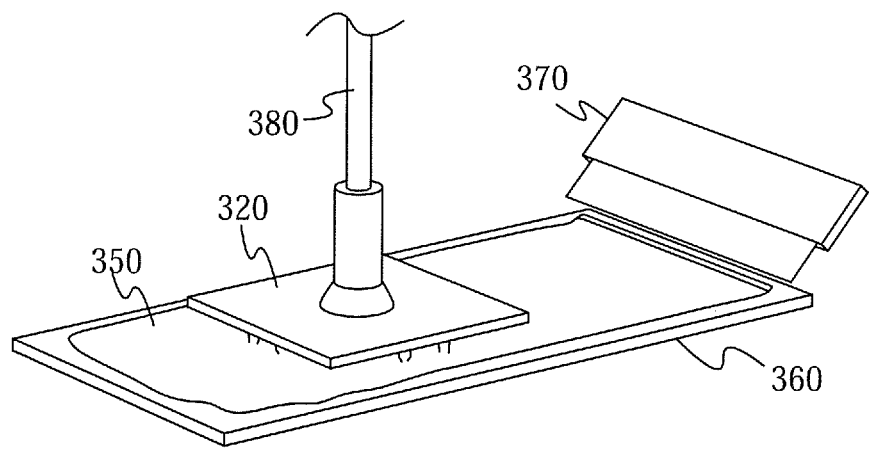
FIGS. 3A-C illustrate different stages of a prior art flip-chip process.
Figure 3B:
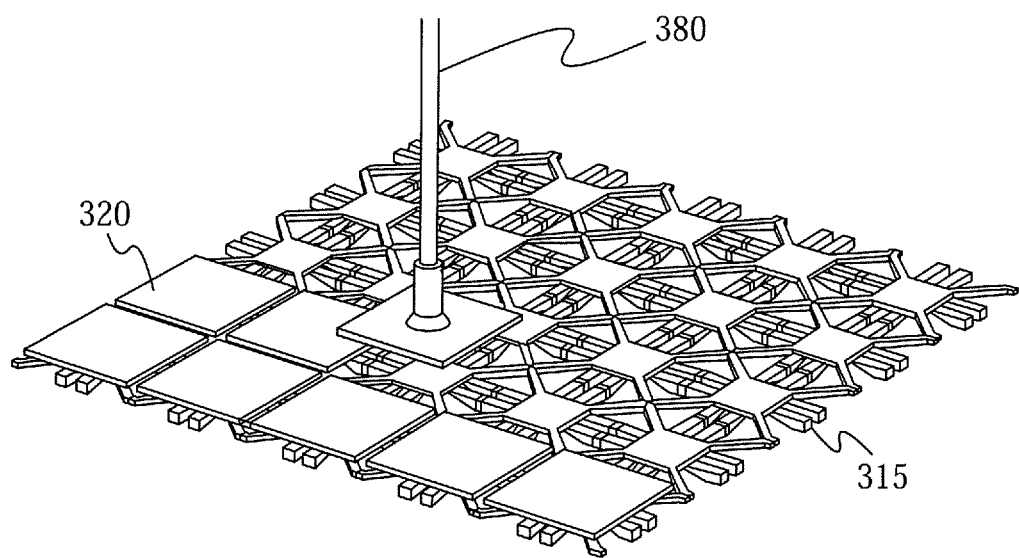
Figure 3C:
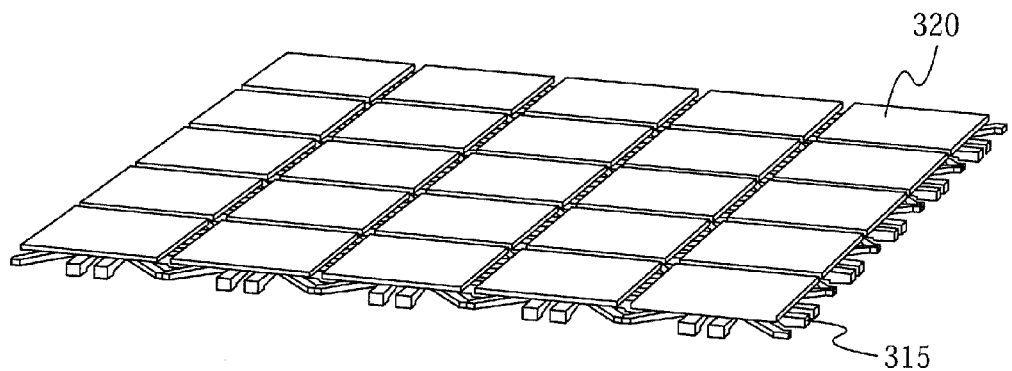
Figure 4A:
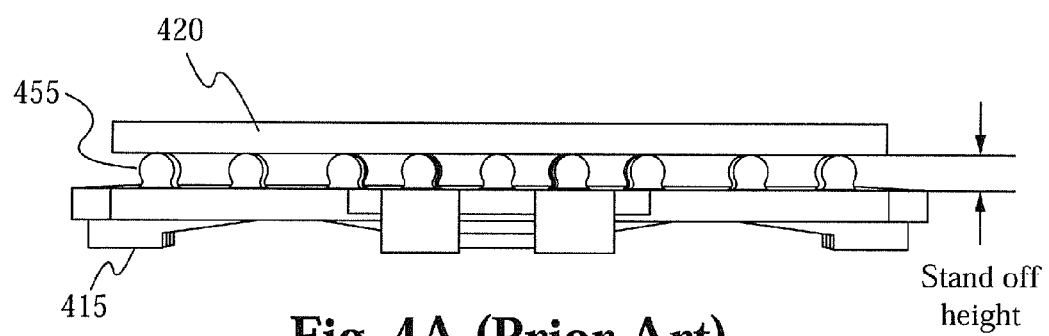
FIG. 4A illustrates a stand-off height between a flip-chip die and a leadframe.
Figure 4B:
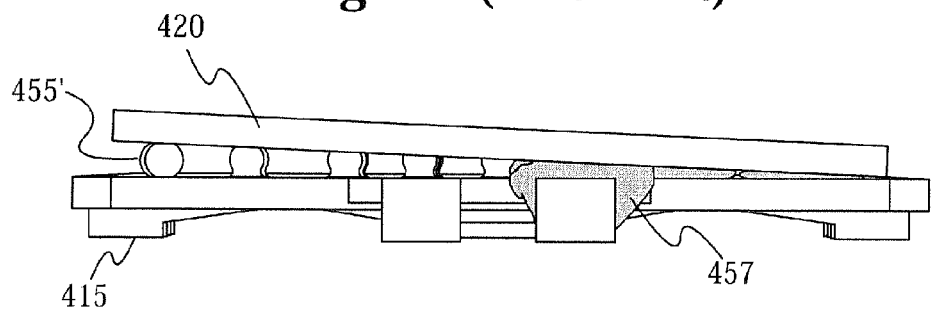
FIGS. 4B-C illustrate improper stand-off height between the flip-chip die and the leadframe.
Figure 4C:
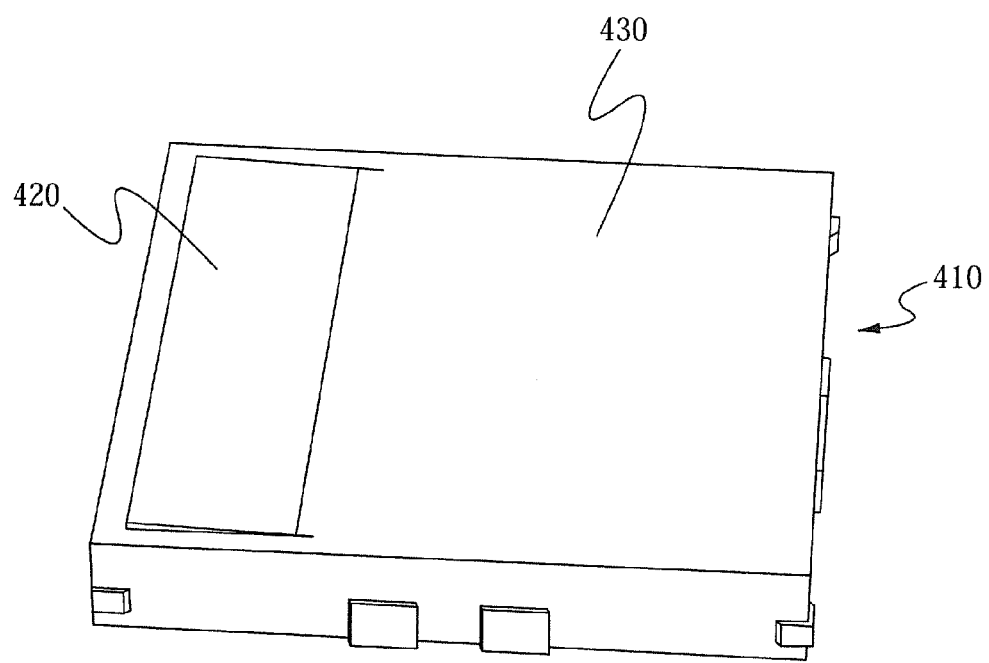
Figure 5A:
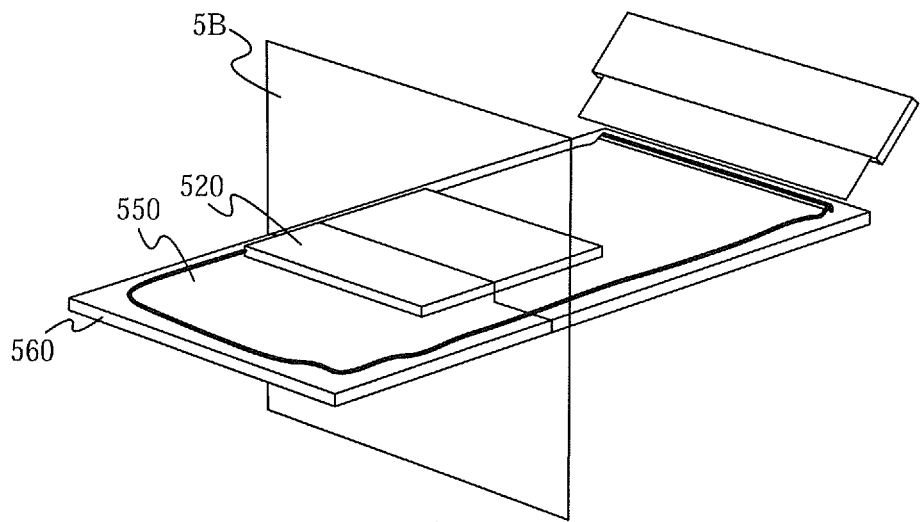
FIG. 5A is a perspective view of a flip-chip die being dipped into soldering flux.
Figure 5B:
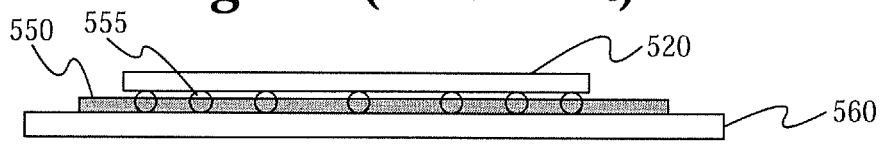
FIG. 5B is a cross-sectional view of a flip-chip die being dipped into soldering flux.
Figure 6A:
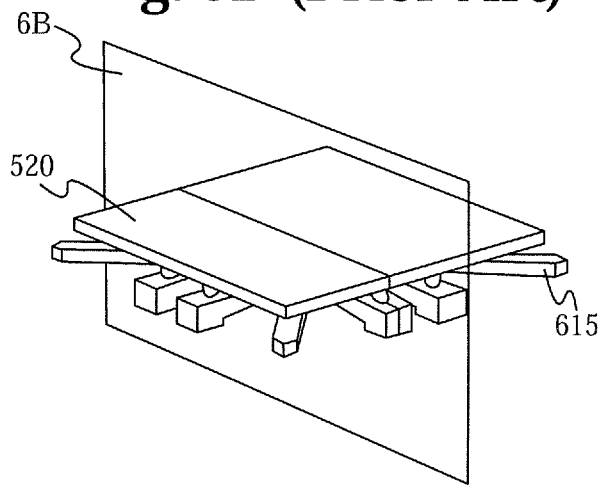
FIG. 6A is a perspective view of a flip-chip die being placed onto a leadframe.
Figure 6B:
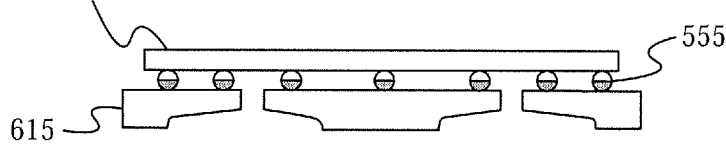
FIG. 6B is a cross-sectional view of a flip-chip die being placed onto a leadframe.
Figure 7A:
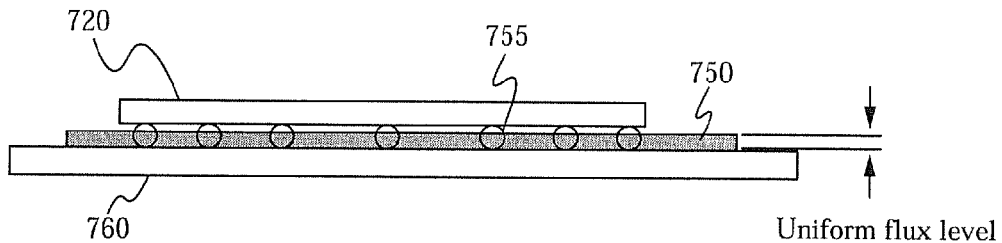
FIGS. 7A-C illustrate a good process for bonding a semiconductor die to a leadframe.
Figure 7B:
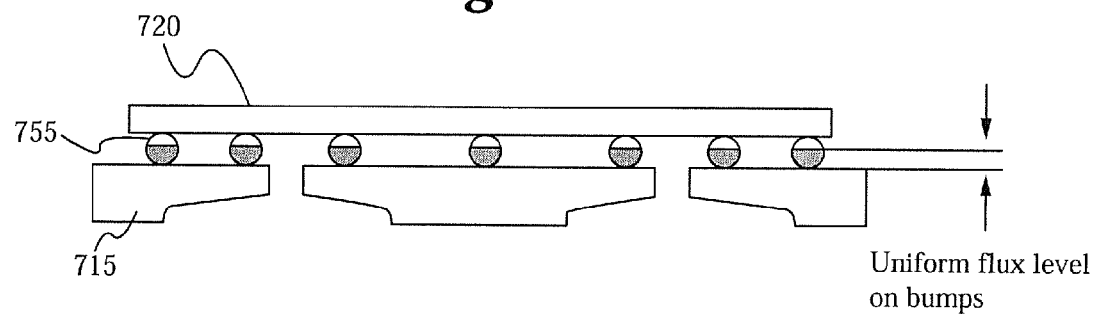
Figure 7C:
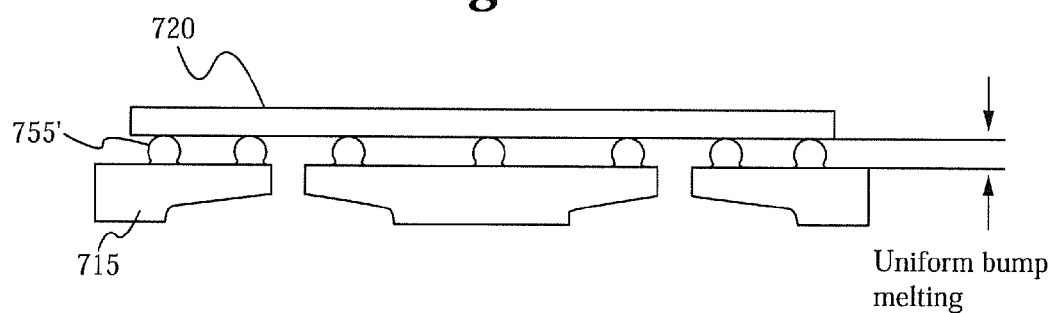
Figure 8A:
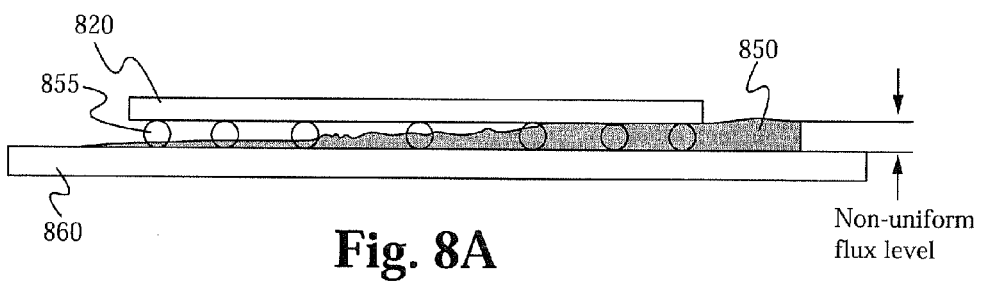
FIGS. 8A-D illustrate a bad process for bonding a semiconductor die to a leadframe.
Figure 8B:
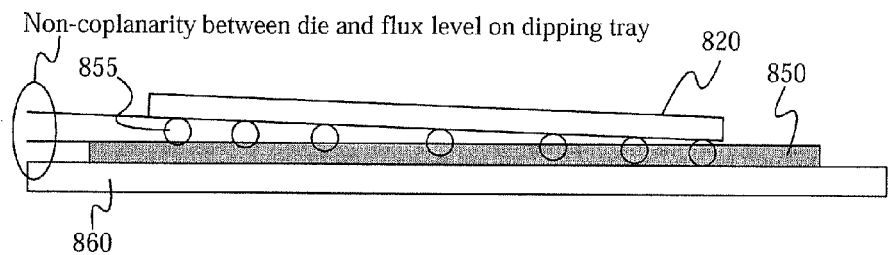
Figure 8C:
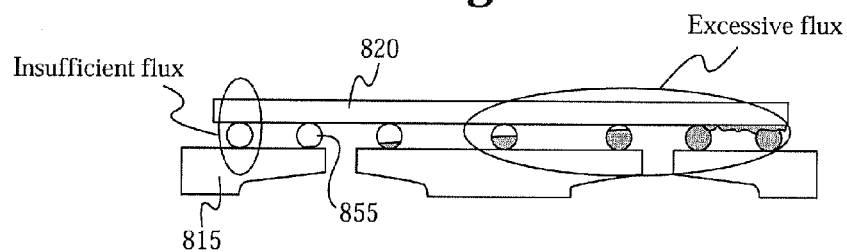
Figure 8D:
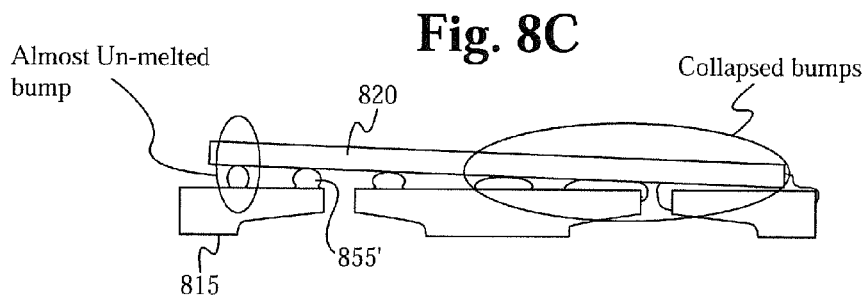
Figure 9:
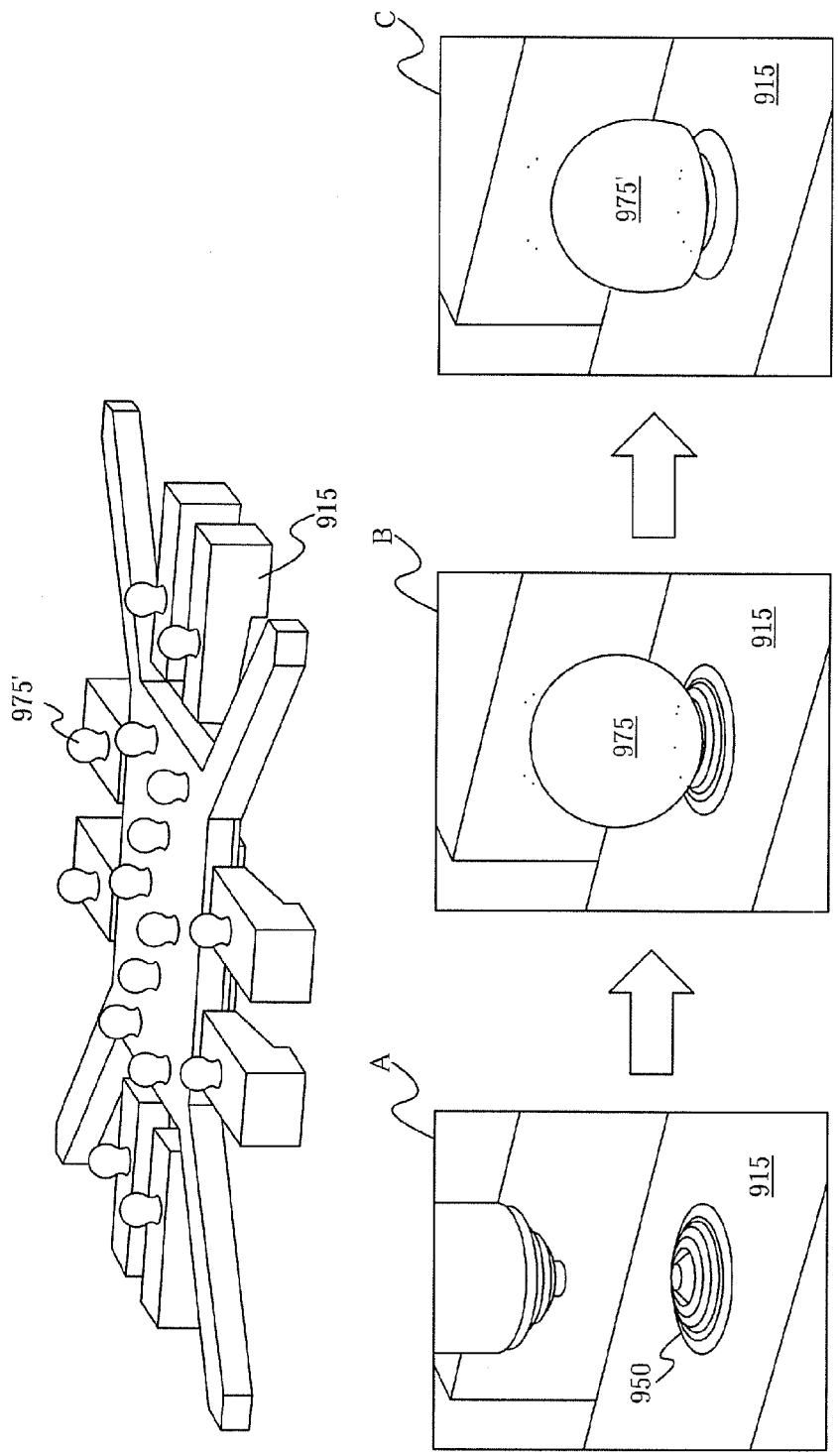
FIG. 9 illustrates one embodiment of a leadframe feature and a ball drop process used to form the leadframe feature in accordance with the principles of the present invention.

FIG. 9 illustrates one embodiment of a leadframe feature and a ball drop process used to form the leadframe feature in accordance with the principles of the present invention. A plurality of support features 975' are disposed on the top surface of a leadframe 915. The support features 975' are configured to maintain the desired stand-off height at all points between the semiconductor die and the leadframe during and after the reflow process in the face of any of the situations that cause the collapse of the connector balls, such as those discussed above with respect to FIGS. 8A-D.

In one embodiment, the support features are formed from non-leadframe material (i.e., material different from the leadframe material), such as bump balls that are placed on the leadframe in order to behave as posts. Preferably, this non-leadframe material has a liquidus temperature that is higher than the connector balls on the semiconductor die. Additionally, the support preferably has a height that is approximately 50%-80% of the height of the connector balls on the semiconductor die.

In some embodiments, the support features 975' are formed using a ball drop process. As seen in window A of FIG. 9, a flux material 950 is placed onto the leadframe 915. Next, in window B, a bump ball 975 is placed on the flux material 950. Finally, in window C, the leadframe 915 undergoes a reflow process, thereby melting the bump ball 975' to the leadframe 915. The bump ball 975' is configured to act as the support feature discussed above. In some embodiments, the bump ball is formed from a solder material. In some embodiments, the bump ball is formed from an alloy. In some embodiments, the bump ball is formed from SAC105.

Figure 10B:
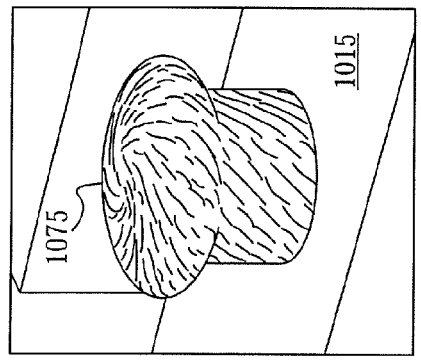
FIGS. 10A-C illustrate one embodiment of a plating process used to form the leadframe feature in accordance with the principles of the present invention.
Figure 10C:
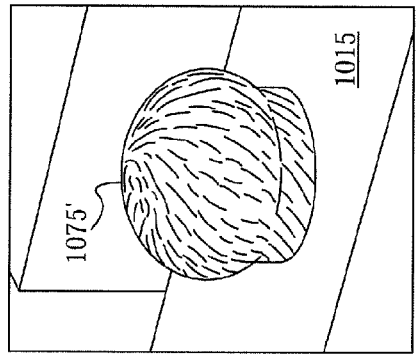
Figure 10A:
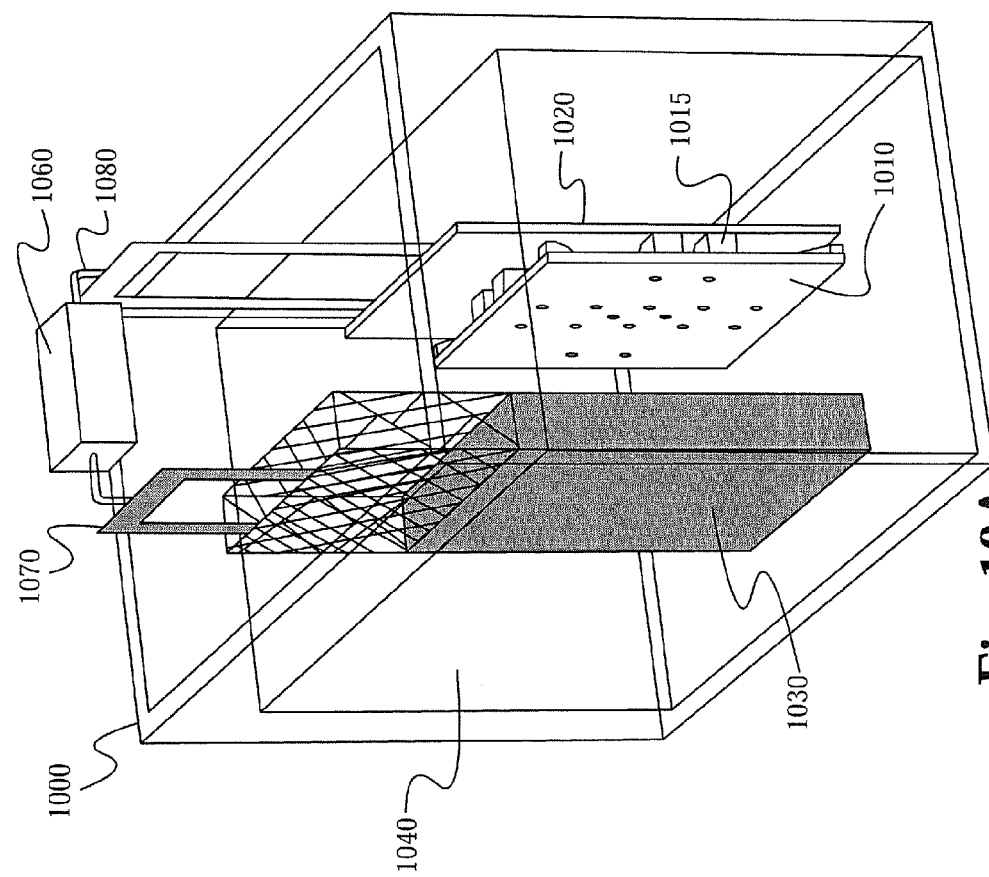

In some embodiments, the leadframe support features are formed using a plating process. FIGS. 10A-C illustrate one embodiment of a plating system and process used to form the leadframe support feature in accordance with the principles of the present invention. As seen in FIG. 10A, a plating tank 1000 is used to hold a plating solution 1040. In some embodiments, the plating solution 1040 comprises one or more dissolved metal salts or other ionic materials. A plating material 1030 is disposed in the plating solution 104. In some embodiments, the plating material 1030 is held in a basket or some other container. The plating material 1030 is the material that will be used to form the leadframe support features. Such plating material 1030 can include, but is not limited to, Ag, Ni, Pd, and Au. It is contemplated that other plating materials can be additionally or alternatively be used. An electrical power source 1060, such as a battery, is provided, with an anode 1070 and a cathode 1080. The anode 1070 is coupled to the basket holding the plating material 1030. The cathode 1080 is coupled to a plate holder 1020, which is disposed in the plating solution 1040. A leadframe 1015 is disposed on the plate holder 1020 within the plating solution 1040. A plating mask 1010 is disposed over the leadframe 1015 and comprises openings aligned over the locations where the support features are to be formed on the leadframe 1015.

When the electrical power source 1060 is switched on, it pulls electrons away from the plating material 1030 and pumps them over to the leadframe 1015. As a result, the leadframe 1015 attracts the positively-charged ions (formed from the plating material 1030) that are floating around in the plating solution 1040. As seen in FIG. 10B, which shows the leadframe 1015 without the plating mask 1010 disposed over it, the plating material particles form the support features 1075, such as bumps, on the leadframe 1015. A reflow process is performed, applying heat to the support features 1075, thereby melting the support features 1075 down into reflown support features 1075', as shown in FIG. 10C.

Figure 11A:
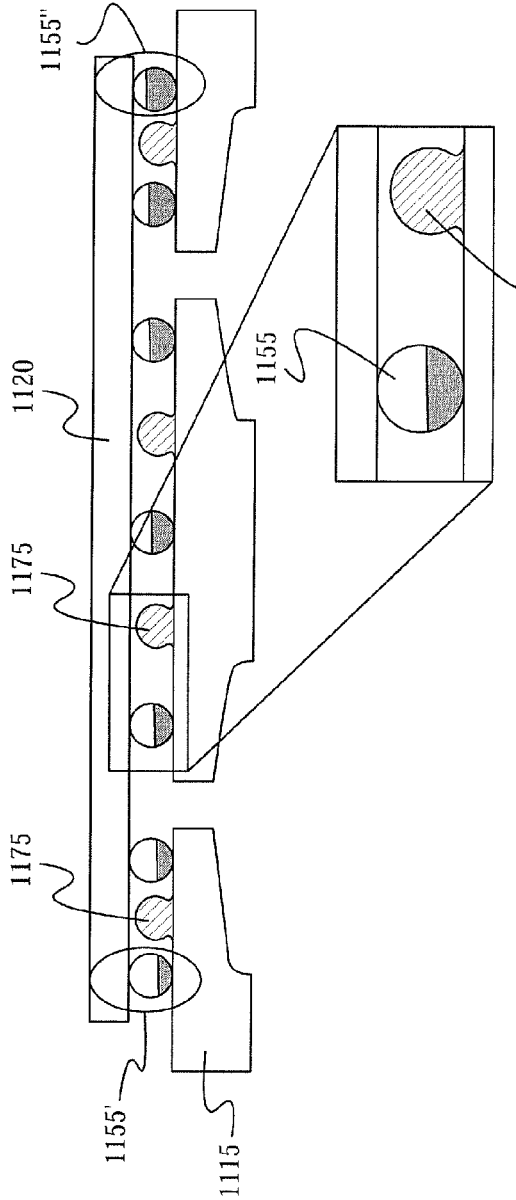
FIGS. 11A-B illustrate one embodiment of the leadframe feature being used to minimize collapse during flip-chip reflow in accordance with the principles of the present invention.
Figure 11B:
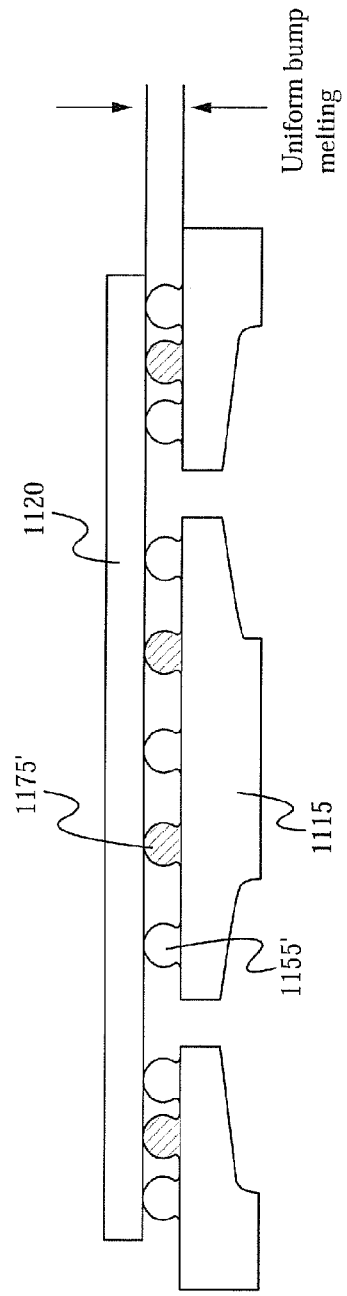

FIGS. 11A-B illustrate one embodiment of the leadframe feature being used to minimize collapse during flip-chip reflow in accordance with the principles of the present invention. FIG. 11A shows a cross-sectional view of die 1120 on leadframe 115 before a reflowing process has been performed. Leadframe support features 1175, such as those discussed above, are disposed on the leadframe 1115. Connector bumps 1155 are coupled to or integrally formed with die 1120. Before being placed on the leadframe 1115, the connector bumps 1155 on the die 1120 are dipped in soldering flux. The die 1120 is then placed on the leadframe

1115, with a portion of the flux-dipped side of the connector bumps 1155 contacting the leadframe 1115. As seen in FIG. 11A, different connector bumps 1155 may have different levels of soldering flux on them. Some connector bumps 1155 may have approximately half of their surface area covered with flux. Some connector bumps 1155' may have a much smaller amount of flux disposed on them. However, these connector bumps 1155' may still have a sufficient amount of flux to activate the appropriate melting. Some connector bumps 1155" may have a much greater amount of flux disposed on them. In a preferred embodiment, the height of the leadframe support features 1175 prior to reflowing is between approximately 50%-80% of the height of the connector bumps 1155.

FIG. 11B shows a cross-sectional view of die 1120 on leadframe 1115 after a reflowing process has been performed. The reflown leadframe support features 1175' support the melting of the reflown connector bumps 1155' on the die 1120, thereby providing uniform bump height across the device package.

Figure 12A:
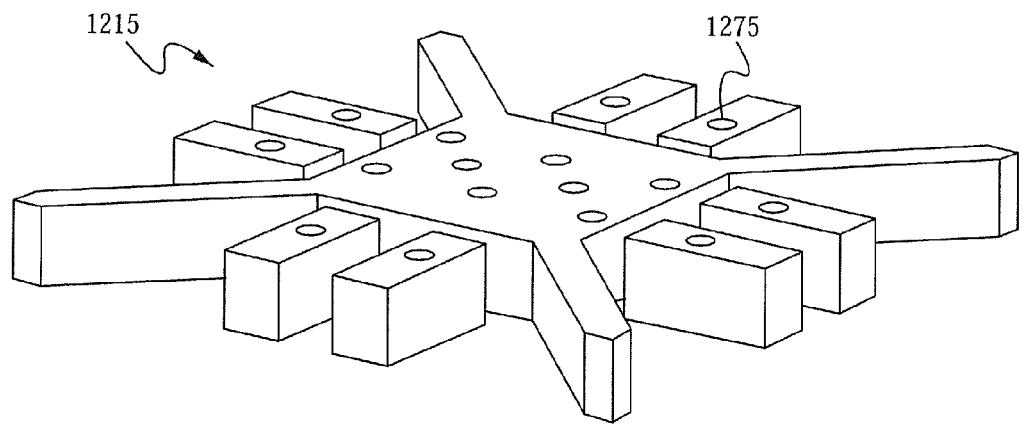
FIGS. 12A-B illustrate one embodiment of forming a leadframe support post in accordance with the principles of the present invention.
Figure 12B:
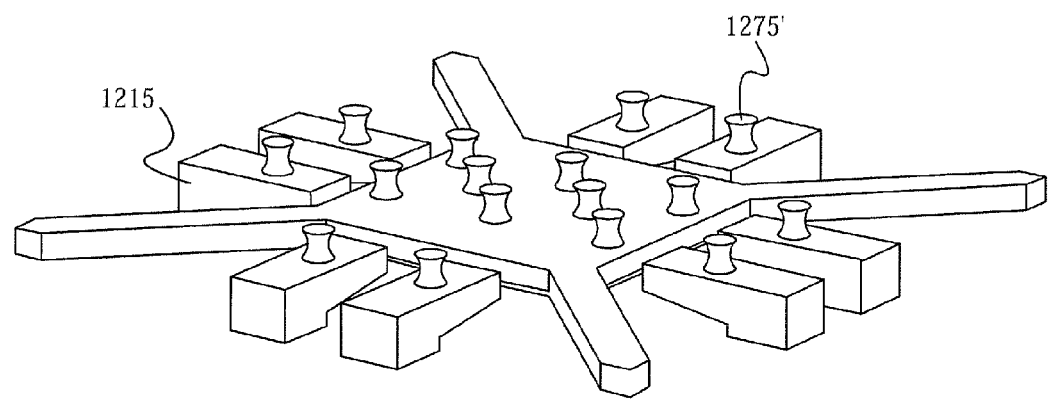

FIGS. 12A-B illustrate one embodiment of forming a leadframe support post in accordance with the principles of the present invention. Here, the leadframe support features are formed from the material of the leadframe 1215. As seen in FIG. 12A, a mask 1275, such as a photo mask, is placed on the leadframe to protect the areas on the leadframe that are not to be etched (i.e., where the support features are to be formed). An etching process is then performed, resulting in the formation of leadframe support features, such as support posts 1275' shown in FIG. 12B. Here, the leadframe material is being utilized to behave as a post to eventually support the die. In a preferred embodiment, the height of the leadframe support features 1275' is between approximately 50%-80% of the height of the connector bumps on the die.

Figure 13:
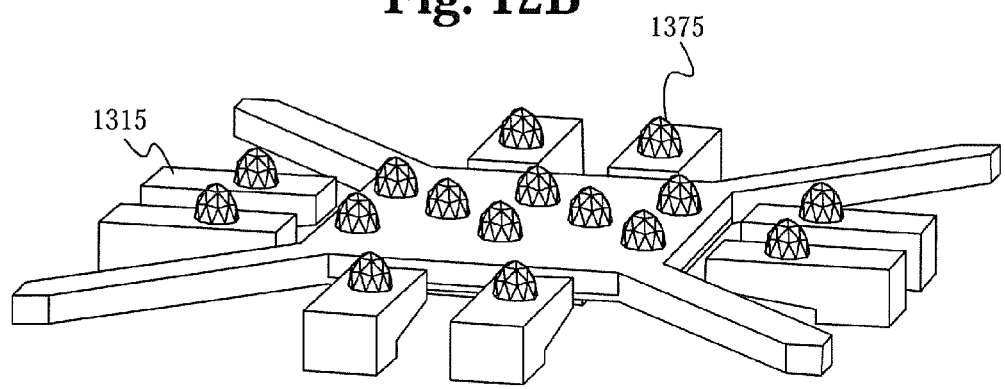
FIG. 13 illustrates one embodiment of a leadframe support post having a coating in accordance with the principles of the present invention.

FIG. 13 illustrates one embodiment of a leadframe support post having a coating in accordance with the principles of the present invention. In this embodiment, the combination of leadframe material and non-leadframe material is used to form leadframe support features 1375 that are configured to support the die. Support posts, such as support posts 1275' in FIG. 12B discussed above, are formed from the same material as the leadframe 1315, such as by an etching process. The support posts are then coated with a material that is different from the leadframe material, thereby forming leadframe support features 1375. In a preferred embodiment, the coated leadframe support features 1375 have a total height between approximately 50%-110% of the height of the connector balls on the die.

It is contemplated the pre-coated support posts can be formed using methods other than etching. For example, in some embodiments, the pre-coated support posts are formed using a stamping process. Other methods can be used as well.

It is contemplated that a variety of different methods are suitable for coating the support posts in order to form the coated leadframe support features. In some embodiments, a screen print process is performed using a coating material such as epoxy. In some embodiments, a dispense process is performed using a coating material such as epoxy. In some embodiments, a plating process is performed using a coating material such as Ag, Ni, Pd, or Au.

Figure 14:
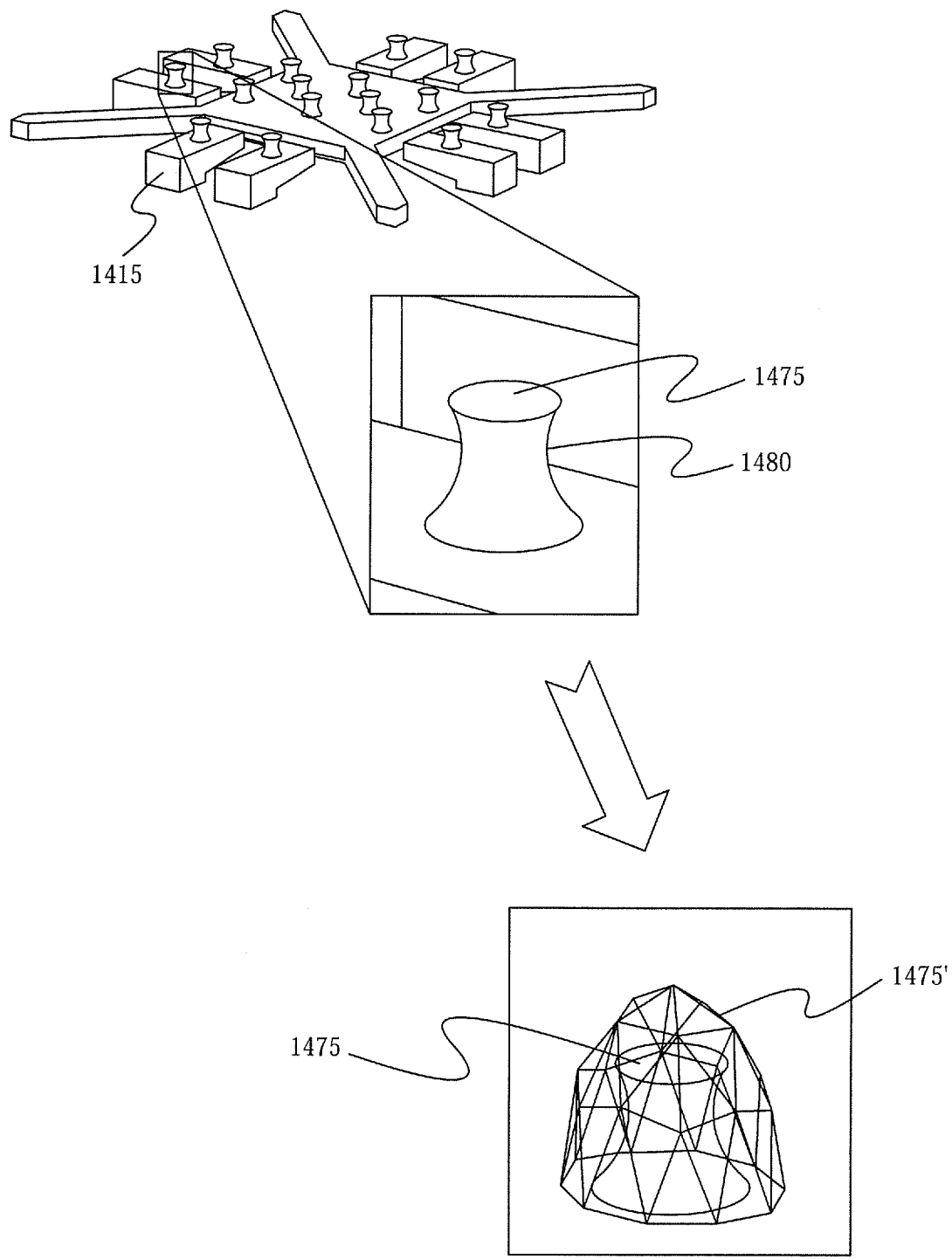
FIG. 14 illustrates one embodiment of the coating of the leadframe support post in accordance with the principles of the present invention.

The coating of the support posts provides several benefits, such as making the posts stronger, reshaping the posts, adding height to the posts, and configuring the posts to provide a cushion to support the die. FIG. 14 illustrates one embodiment of the coating of the leadframe support post in accordance with the principles of the present invention. Leadframe 1415 comprises support posts 1475, which have been etched similar to support posts 1275' in FIG. 12B discussed above. As a result of the nature of the etching process, the vertical shape of the support posts 1475 is not perpendicularly etched. The sidewall 1480 is over-etched, as well as being etched more at the top, resulting in a weak point. After the coating process, the shape of the leadframe support feature 1475' is more robust. Its height is also increased above that of the pre-coated support post 1475. Additionally, the coating material behaves as a cushion at the point where it supports the die.

Figure 15A:
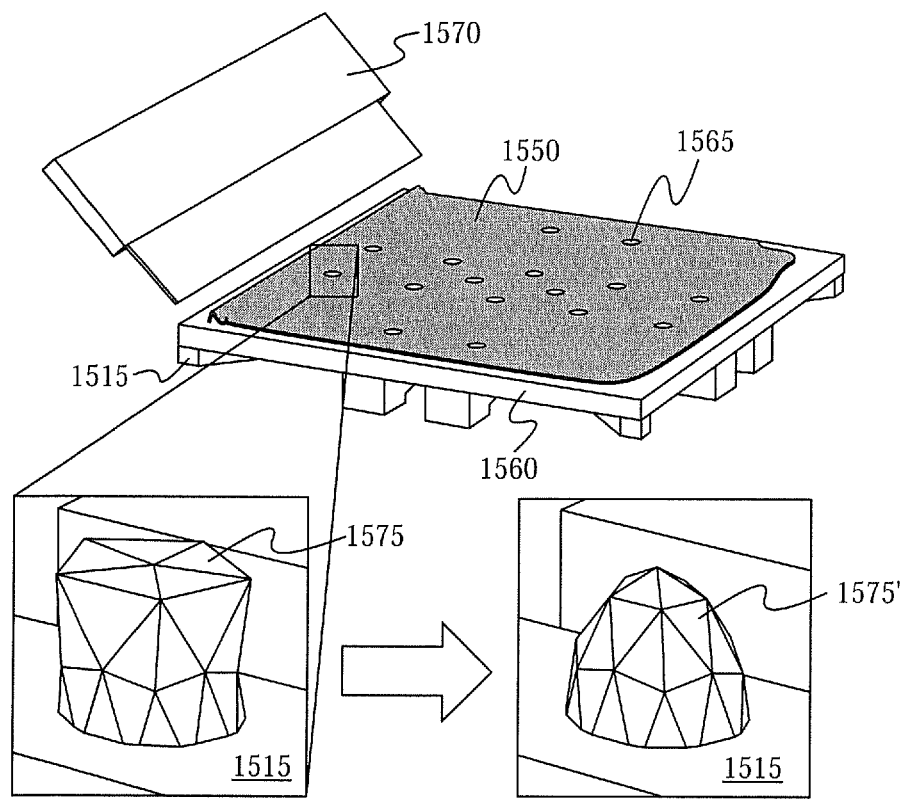
FIGS. 15A-B illustrate one embodiment of foaming a leadframe support post using a screen print process in accordance with the principles of the present invention.
Figure 15B:
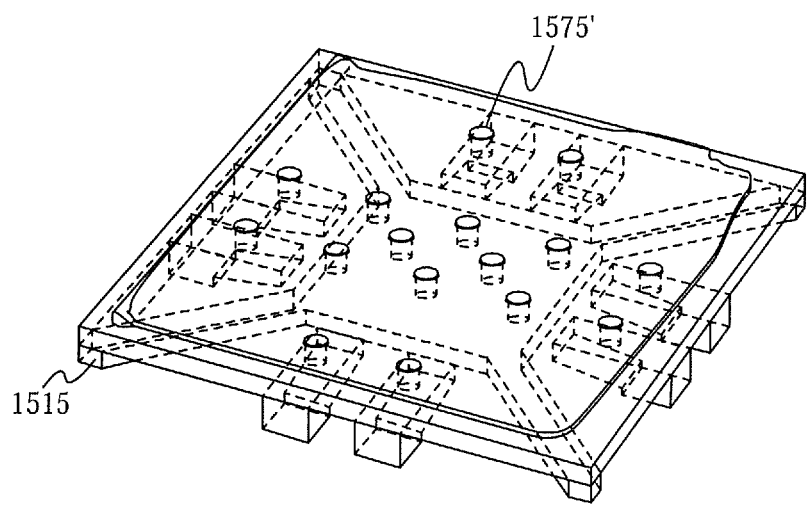

FIGS. 15A-B illustrate one embodiment of forming a leadframe support post using a screen print process in accordance with the principles of the present invention. In FIG. 15A, a screen print plate 1560 is placed on a leadframe 1515, thereby acting as a stencil. FIG. 15B shows x-ray detail of the leadframe 1515 under the screen print plate. Epoxy 1550 is placed on the screen print plate 1560 and leveled-off using a flux equalizer squeegee 1570. Epoxy fills in the holes 1565 in the screen print plate 1560, thereby reaching the leadframe 1515 in select locations where the support features are to be formed. As seen in the close-up view of one of the holes 1565, an epoxy support structure 1575 remains on the leadframe 1515 after the screen print plate 1560 has been removed. An epoxy cure process is then performed, thereby reshaping the epoxy and forming the leadframe support feature 1575'.

Figure 16:
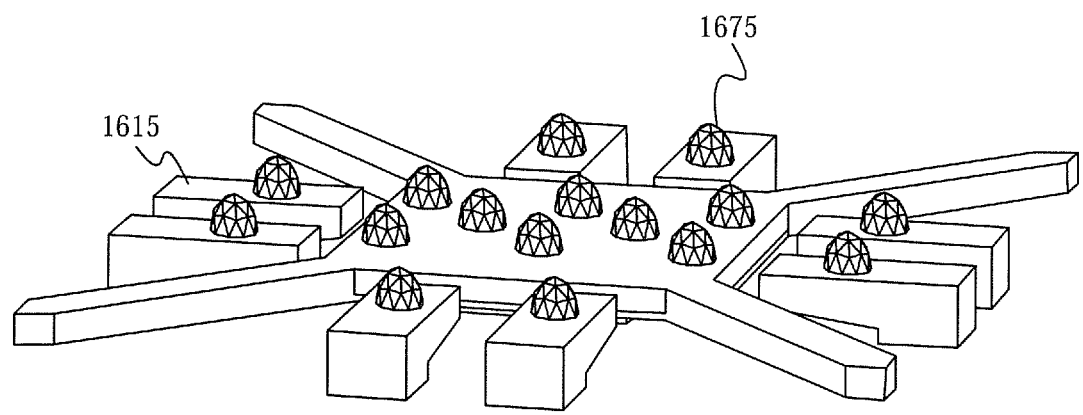
FIG. 16 illustrates another embodiment of a leadframe support post having a coating in accordance with the principles of the present invention.

FIG. 16 illustrates another embodiment of a leadframe support post having a coating in accordance with the principles of the present invention. Coated leadframe support features 1675 are disposed on the leadframe 1615. Here, non-leadframe material is used to coat support posts that are formed from non-leadframe material. In some embodiments, the coated support posts 1675 have a height between approximately 50%-110% of the connector ball on the die.

It is contemplated that these leadframe support features 1675 can be fabricated in a variety of ways. In some embodiments, the pre-coated support posts are formed using either the ball drop process or the plating process discussed above with respect to FIGS. 9-10C. Other methods of forming the pre-coated support posts are also within the scope of the present invention. It is contemplated that a variety of different methods are suitable for coating the support posts in order to form the coated leadframe support features. In some embodiments, a screen print process is performed using a coating material such as epoxy. In some embodiments, a dispense process is performed using a coating material such as epoxy. In some embodiments, a plating process is performed using a coating material such as Ag, Ni, Pd, or Au.

Figure 17:
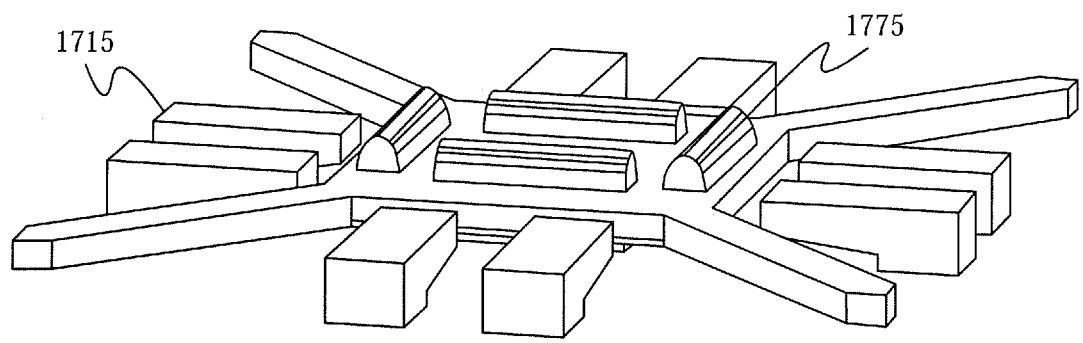
FIG. 17 illustrates one embodiment of a leadframe support bar in accordance with the principles of the present invention.

It is contemplated that the leadframe support feature of the present invention can be formed in a variety of shapes other than those shown in FIGS. 9-16. FIG. 17 illustrates one embodiment of the leadframe support features each comprising a bar-shape in accordance with the principles of the present invention. The bar-shaped support features 1775 are disposed on the leadframe 1715. Any of the methods and materials for fabrication discussed above can be used to form these bar-shaped support features.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A leadframe device comprising:
a leadframe having a top surface;
a plurality of support features disposed on the top surface of the leadframe, wherein the plurality of support features comprise a material different from the leadframe and are configured to support a flip-chip semiconductor die, the plurality of the support features are also configured as bump balls reflowed to the top surface of the leadframe;
the flip-chip semiconductor die comprising a plurality of connector bumps coupled to the top surface of the leadframe, the plurality of connector bumps each disposed inline between a bottom surface of the semiconductor die and the top surface of the leadframe wherein each of the plurality of support features has a height less than a height of each of the plurality of connector bumps, and each of the plurality of connector bumps comprises a material that melts during a reflow process and each of the plurality of support features comprises a different material than the plurality of connector bumps and that maintains a specific height during the reflow process in a case of improper collapse of one or more connector bumps, wherein the material of each of the plurality of support features has a higher liquidus temperature than the material of the connector bumps; and
a coating material covering at least a portion of the top of each support feature, but not the bottom of each support feature, wherein the coating material is a plating material, and wherein the plating material is selected from the grow consisting of: silver, nickel, palladium, and gold.

2. The device of claim 1, wherein the plurality of support features comprise epoxy.

3. The device of claim 1, wherein the plurality of support features comprise at least one material from the group of materials consisting of: silver, nickel, palladium, and gold.

4. The device of claim 1, wherein the support features are substantially ball-shaped.

5. The device of claim 1, wherein the support features are each found in the shape of an elongated bar.

6. The device of claim 1, wherein the plurality of connector bumps comprise a material different from the plurality of support features.

7. A leadframe device comprising:
a leadframe comprising leadframe material and having a top surface;
a semiconductor die coupled to the leadframe, wherein the semiconductor die comprises a plurality of connector bumps each positioned against the top surface of the leadframe the plurality of connector bumps each disposed inline between a bottom surface of the semiconductor die and the top surface of the leadframe; and
a plurality of support features extending from the top surface of the leadframe, wherein the support structures are formed from the leadframe and are configured to maintain a stand-off height daring a reflow process of the connector bumps in the case of has a top surface separated by the stand-off height from the top surface of the leadframe, a coating material covering at least a portion of the top of each support feature, but not the bottom of each support feature, wherein the coating material is a plating material, and wherein the plating material is selected from the group consisting of: silver, nickel, palladium, and gold.

8. The device of claim 7, wherein the plurality of support features are substantially ball-shaped.

9. The device of claim 7, wherein the plurality of support features are each formed in the shape of an elongated bar.

10. The device of claim 7, wherein the plurality of connector bumps comprise a material different from the leadframe.

11. The device of claim 7, wherein the stand-off height is a distance between a first surface of the semiconductor die and the top surface of the leadframe, further wherein the plurality of connector bumps are coupled to the first surface of the semiconductor die.

12. A leadframe device comprising:
a leadframe having a substantially planar top surface;
a semiconductor die coupled to the leadframe, wherein the semiconductor die is coupled to the top surface of the leadframe via a plurality of connector bumps each disposed inline between a bottom surface of the semiconductor die and the top surface of the leadframe; and
a plurality of support features disposed on the top surface of the leadframe, wherein the plurality of support features comprise a material different from the leadframe, are configured to support the semiconductor die and are configured as bumps plated to the top surface of the leadframe, wherein each of the plurality of connector bumps comprises a material that melts during a reflow process and each of the plurality of support structures comprises a different material than the plurality of connector bumps and that maintains a specific height during the reflow process in the case of improper collapse of one or more connector bumps, a coating material covering at least a portion of the top of each support feature, but not the bottom of each support feature, wherein the coating material is a plating material, and wherein the plating material is selected from the group consisting of: silver, nickel, palladium, and gold.

13. The device of claim 11, wherein in the case of improper collapse of one or more connector bumps one or more of the support features contact the first surface of the semiconductor die.

* * * * *